(12) United States Patent
Wu et al.

(10) Patent No.: US 7,630,125 B2
(45) Date of Patent: Dec. 8, 2009

(54) LASER MODULE

(75) Inventors: Hsin-Chang Wu, Hsinchu (TW); Shang-Yi Wu, Hsinchu (TW)

(73) Assignee: Young Optics Inc., Hsinchu (TW)

( * ) Notice: Subject to any disclaimer, the term of this patent is extended or adjusted under 35 U.S.C. 154(b) by 0 days.

(21) Appl. No.: 11/954,075

(22) Filed: Dec. 11, 2007

(65) Prior Publication Data
US 2009/0147349 A1    Jun. 11, 2009

(51) Int. Cl.
*G02F 1/35* (2006.01)
*G02F 2/02* (2006.01)

(52) U.S. Cl. .................. 359/326; 372/22; 372/106

(58) Field of Classification Search ......... 359/326–332; 372/21, 22, 105, 106; 385/122
See application file for complete search history.

(56) References Cited
U.S. PATENT DOCUMENTS

| | | | |
|---|---|---|---|
| 4,953,166 A | 8/1990 | Mooradian | |
| 5,047,668 A * | 9/1991 | Bosenberg | 359/330 |
| 6,243,407 B1 | 6/2001 | Mooradian | |
| 6,320,886 B1 * | 11/2001 | Dawber et al. | 372/22 |
| 6,751,010 B1 * | 6/2004 | Richter | 359/330 |
| 6,778,582 B1 | 8/2004 | Mooradian | |
| 7,322,704 B2 * | 1/2008 | Shchegrov | 353/94 |
| 7,349,149 B2 * | 3/2008 | Lefebvre et al. | 359/330 |

* cited by examiner

*Primary Examiner*—Daniel Petkovsek
(74) *Attorney, Agent, or Firm*—J.C. Patents

(57) ABSTRACT

A laser module including a light emitter, a polarizing and filtering unit, a nonlinear optical crystal, and a first filter is provided. The light emitter emits a first beam. The polarizing and filtering unit is disposed on a transmission path of the first beam. A part of the first beam passes through the polarizing and filtering unit to become a second beam with a specific polarization direction. The nonlinear optical crystal is disposed on a transmission path of the second beam from the polarizing and filtering unit. The nonlinear optical crystal converts a part of the second beam into a third beam. The first filter is disposed on a transmission path of a non-converted part of the second beam and the third beam from the nonlinear optical crystal. The non-converted part of the second beam is reflected by the first filter. The third beam passes through the first filter.

19 Claims, 4 Drawing Sheets

LASER MODULE

BACKGROUND OF THE INVENTION

1. Field of the Invention

The present invention generally relates to a light source module. More particularly, the present invention relates to a laser module.

2. Description of Related Art

Referring to FIG. 1, a conventional Novalux extended cavity surface emitting laser (NECSEL) 100 includes a light emitter 110, a volume Bragg grating (VBG) 120 and a periodically poled lithium niobate crystal (PPLN crystal) 130. The light emitter 110 includes a light emitting layer 112, a p-type distributed Bragg reflector (DBR) 114 and an n-type DBR 16. The p-type DBR 14 and the n-type DBR 16 are disposed on two opposite sides of the light emitting layer 112, respectively. The light emitting layer 112 is capable of emitting an initial infrared (IR) beam 112$i$. The initial IR beam 112$i$ passes through the n-type DBR 116, passes through the PPLN crystal 130, is reflected by the VBG 120, returns to the PPLN crystal 130, passes through the PPLN crystal 130, passes through the n-type DBR 116, passes through the light emitting layer 112, and is reflected by the p-type DBR 14 in sequence. The p-type DBR 14 and the VBG 120 form an internal cavity C therebetween. After the initial IR beam 112$i$ is reflected within the internal cavity C many times, the light emitting layer 112 generates stimulated emission and emits an IR beam 112$a$ with coherence, and the IR beam 112$a$ resonates within the internal cavity C. When passing through the PPLN crystal 130, a part of the IR beam 112$a$ is converted 130 into a visible beam 112$b$ by the PPLN crystal 130. The visible beam 112$b$ with coherence is then pass through the VBG 120 and travels outward.

In the NECSEL 100, the transmission and reflection spectra of the VBG 120 are varied with the temperature of the VGB 120, and the wavelength corresponding to the maximum of beam conversion ratios of the PPLN crystal 130 is varied with the temperature of the PPLN crystal 130. Therefore, the temperature of the VBG 120 and the temperature of the PPLN crystal 130 preferably match each. Otherwise, the proportion of the beam conversion from the IR beam 112$a$ to the visible beam 112$b$ of the PPLN crystal 130 decreases because the wavelength of the IR beam 112$a$ reflected by the VBG 120 deviates away from the wavelength corresponding to the maximum of beam conversion ratios of the PPLN crystal 130 at the temperature at that time. When the NECSEL 100 is in operation, the temperature of the VBG 120 is increased by absorbing a part of energy of the visible beam 112$b$, which causes the temperature mismatch between the VBG 120 and the PPLN crystal 130. In order to prevent the reduction of the proportion of the visible beam 112$b$ converted from the IR beam 112$a$, the temperature of the PPLN crystal 130 is adjusted to make the temperatures of the VBG 120 and the PPLN crystal 130 match each other. In this way, the wavelength of the visible beam 112$b$, however, deviates away from a predetermined value. When the laser module 100 is applied in a projection apparatus, the wavelength deviation of the visible beam 112$b$ makes the color temperature of the image projected by the projection apparatus deviate to an unfavorable value.

SUMMARY OF THE INVENTION

Accordingly, the present invention is directed to a laser module, which can provide a coherent beam with a stable wavelength.

Other advantages of the present invention can be further comprehended from the technical features disclosed in the present invention.

One embodiment of the present invention provides a laser module including a light emitter, a polarizing and filtering unit, a nonlinear optical crystal, and a first filter. The light emitter is capable of emitting a first beam. The polarizing and filtering unit is disposed on a transmission path of the first beam. A part of the first beam passes through the polarizing and filtering unit to become a second beam with a specific polarization direction. The nonlinear optical crystal is disposed on a transmission path of the second beam from the polarizing and filtering unit. The nonlinear optical crystal is capable of converting a part of the second beam passing therethrough into a third beam, and a wavelength of the third beam is smaller than a wavelength of the second beam. The first filter is disposed on a transmission path of a non-converted part of the second beam not converted by the nonlinear optical crystal and the third beam from the nonlinear optical crystal. The non-converted part of the second beam passing through the nonlinear optical crystal is reflected by the first filter. The third beam passes through the first filter. A first bandwidth range of a transmission spectrum of the polarizing and filtering unit is narrower than and falls within a second bandwidth range of a reflection spectrum of the first filter.

In the laser module according to an embodiment of the present invention, the wavelengths of the second beam and the third beam are determined by the polarizing and filtering unit which may use a transparent material, for example, glass or fused silica, almost not absorbing the first, second, and third beams, such that the wavelength deviations of the second beam and the third beam due to light absorption of the polarizing and filtering unit are reduced. Therefore, the laser module provides a coherent beam, i.e. the third beam, with a stable wavelength.

Other features and advantages of the present invention will be further understood from the further technology features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which is shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component facing "B" component directly or one or more additional components is between "A" component and "B" component. Also, the description of "A" component "adjacent to" "B" component herein may contain the situations that "A" component is directly "adjacent to" "B" component or one or more additional components is between "A" component and "B" component. Accordingly, the drawings and descriptions will be regarded as illustrative in nature and not as restrictive.

In the description of the embodiments of the present invention, the bandwidth range of the transmission/reflection spectrum of an optical element is defined as a wavelength range that corresponds to the transmittances in the transmission/reflection spectrum greater than and equal to 50 percent of a maximum transmittance in the transmission/reflection spectrum.

Figure 1:
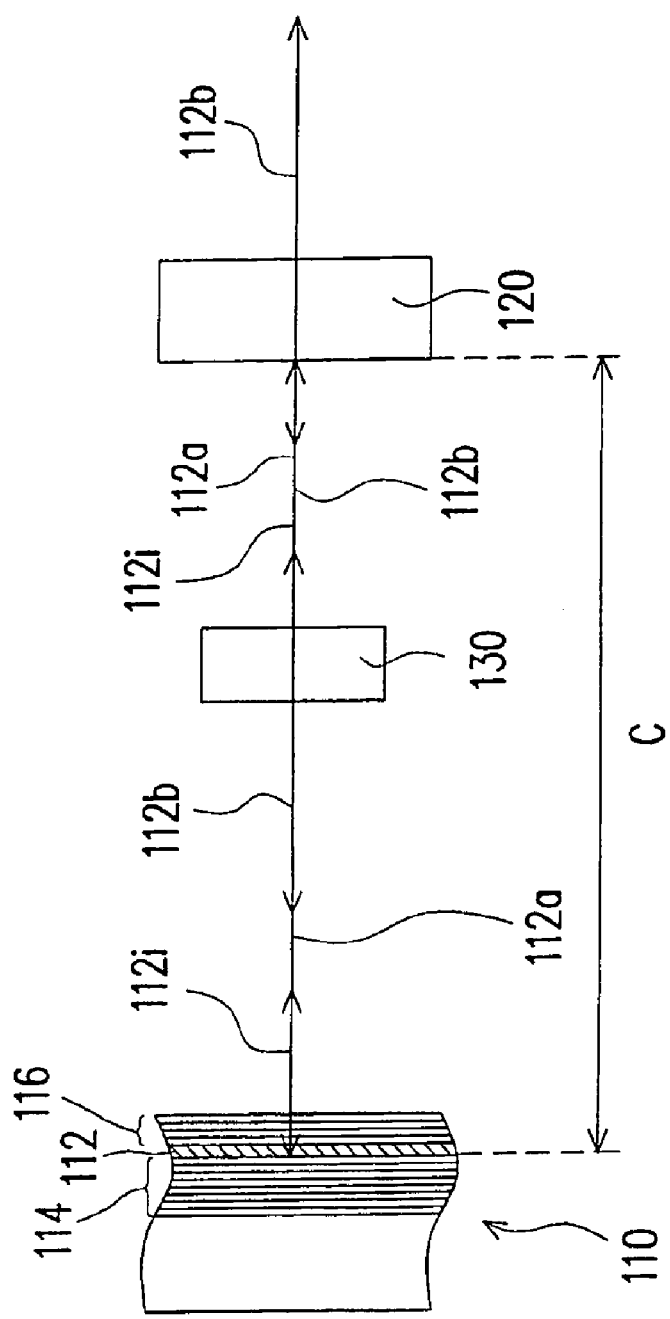
FIG. 1 is a schematic structural view of a conventional Novalux extended cavity surface emitting laser.
Figure 2:
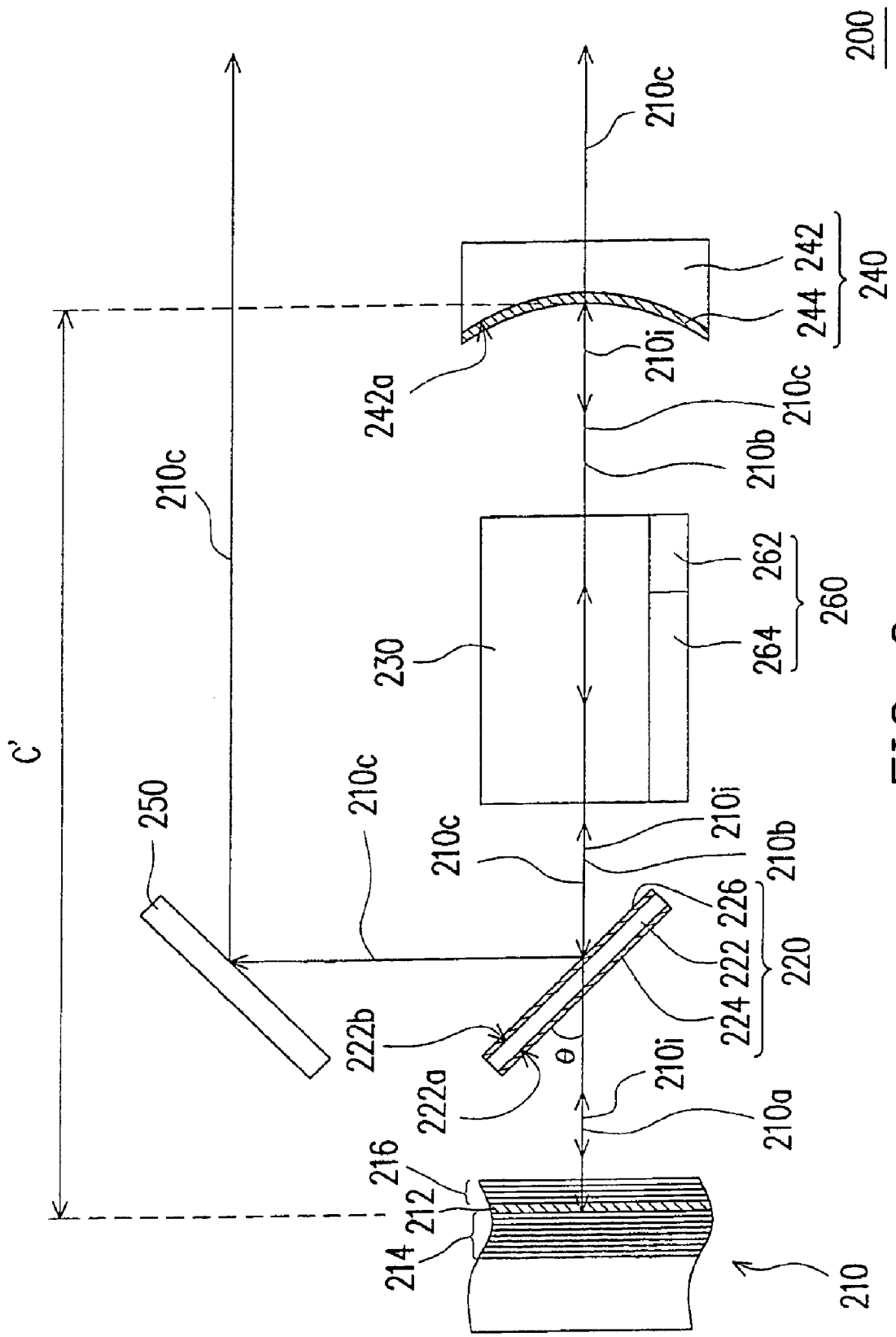
FIG. 2 is a schematic structural view of a laser module according to an embodiment of the present invention.

Referring to FIG. 2, a laser module 200 according to an embodiment of the present invention includes a light emitter 210, a polarizing and filtering unit 220, a nonlinear optical crystal 230, and a first filter 240. In the present embodiment, the light emitter 210 includes a light emitting layer 212, a reflecting unit 214 and a partially transmitting and partially reflecting unit 216. When the light emitter 210 is starting to work, the light emitting layer 212 emits an initial beam 210i. Then, a part of the initial beam 210i passes through the partially transmitting and partially reflecting unit 216, passes through the polarizing and filtering unit 220, passes through the nonlinear optical crystal 230, is reflected by the first filter 240, passes through the nonlinear optical crystal 230 again, passes through the polarizing and filtering unit 220 again, passes through the partially transmitting and partially reflecting unit 216 again, passes through the light emitting layer 212, is reflected by the reflecting unit 214, and passes through the light emitting layer 212 again in sequence. After the initial beam 210i is reflected between the reflecting unit 216 and the first filter 240 many times, the light emitting layer 212 generates stimulated emission and emits a first beam 210a with coherence, such that the light emitter 210 is capable of emitting a first beam 210a with coherence.

The polarizing and filtering unit 220 is disposed on a transmission path of the first beam 210a. In the present embodiment, both the reflecting unit 214 and the partially transmitting and partially reflecting unit 216 are, for example, distributed Bragg reflectors (DBRs). Additionally, the light emitting layer 212 is, for example, a quantum well between the two DBRs. The reflecting unit 214 is disposed on one side of the light emitting layer 212 for reflecting the first beam 210a. The partially transmitting and partially reflecting unit 216 is disposed on another side of the light emitting layer 212 opposite to the reflecting unit 214 and on the transmission path of the first beam 210a between the light emitting layer 212 and the polarizing and filtering unit 220. Moreover, a part of the first beam 210a is reflected between the reflecting unit 214 and the partially transmitting and partially reflecting unit 216, and the other part of the first beam 210a passes through the partially transmitting and partially reflecting unit 216 and travels to the polarizing and filtering unit 220.

A part of the first beam 210a passes through the polarizing and filtering unit 220 to become a second beam 210b with a specific polarization direction, in which the specific polarization direction is, for example, a p-polarization direction. In the present embodiment, the polarizing and filtering unit 220 includes a substrate 222, a first polarizing and filtering film 224, and a second polarizing and filtering film 226. The substrate 222 has a first surface 222a and a second surface 222b opposite to each other. The first polarizing and filtering film 224 is disposed on the first surface 222a, while the second polarizing and filtering film 226 is disposed on the second surface 222b. The part of the first beam 210a emitted from the light emitter 210 passes through the first polarizing and filtering film 224, the first surface 222a, the second surface 222b, and the second polarizing and filtering film 226 to become the second beam 210b with the specific polarization direction. Then, the second beam 210b travels to the nonlinear optical crystal 230. In the present embodiment, the incident angle θ of the first beam 210a incident on the polarizing and filtering unit 220 (i.e. incident on the first polarizing and filtering film 224) is substantially equal to 45 degrees for increasing the amount of the second beam 210b with the specific polarization direction.

The nonlinear optical crystal 230 is disposed on a transmission path of the second beam 210b from the polarizing and filtering unit 220. The nonlinear optical crystal 230 is capable of converting a part of the second beam 210b passing therethrough into a third beam 210c, and a non-converted part of the second beam 210b passes through the nonlinear optical crystal 230 without being converted. The wavelength of the third beam 210c is smaller than the wavelength of the second beam 210b. In the present embodiment, the nonlinear optical crystal 230 is, for example, a periodically poled optical crystal. In particular, the nonlinear optical crystal 230 is, for example, a periodically poled lithium niobate (PPLN) crystal or a periodically poled potassium titanyl phosphate crystal (PPKTP crystal). However, in other embodiments, the nonlinear optical crystal may be an aperiodically poled optical crystal or other types of nonlinear optical crystals. In the present embodiment, the wavelength of the third beam 210c is half the wavelength of the second beam 210b. More particularly, the first beam 210a and the second beam 210b are, for example, IR beams, and the third beam 210c is, for example, a visible beam.

The first filter 240 is disposed on a transmission path of the other part of the second beam 210b and the third beam 210c from the nonlinear optical crystal 230. The non-converted part of the second beam 210b passing through the nonlinear optical crystal 230 is reflected by the first filter 240. The third beam 210c passes through the first filter 240. In the present embodiment, the first filter 240 includes a lens 242 and a dichroic film 244. The lens 242 has a concave surface 242a facing the nonlinear optical crystal 230. The dichroic film 244 is disposed on the concave surface 242a. In particular, the dichroic film 244 is capable of reflecting an IR beam (i.e. the second beam 210b) and capable of being passed through by a visible beam (i.e. the third beam 210c), for example. As such, the second beam 210b resonates in an internal cavity C' formed between the reflecting unit 214 and the first filter 240. Then, the third beam 210c with coherence converted from the second beam 210b with coherence passes through the first filter 240 and travels outward.

On the other hand, the part of the second beam 210b reflected from the first filter 240 and passing through the nonlinear optical crystal 230 is converted into the third beam 210c which then travels to the polarizing and filtering unit 220. In the present embodiment, the polarizing and the filtering unit 220 is capable of reflecting the third beam 210c from the nonlinear optical crystal 230. More particularly, the second polarizing and filtering film 226 is capable of reflecting the visible beam (i.e. the third beam 210c) and capable of being passed through by the IR beam (i.e. the second beam 210b), for example, such that the second polarizing and filtering film 226 reflects the third beam 210c from the nonlinear optical crystal 230 and is passed through by the second beam 210b from the nonlinear optical crystal 230. In the present embodiment, the laser module 200 further comprises a reflector 250 disposed on a transmission path of the third beam 210c reflected from the polarizing and filtering unit 220. In the present embodiment, the reflector 250 reflects the third beam 210c to make the third beam 210c travel along substantially the same direction as the third beam 210c passing through the first filter 240 travels along.

It should be noted that the polarizing and filtering unit 220 is not limited to have both the first and second polarizing and filtering films 224 and 226 in the present invention. In other embodiments (not shown), the polarizing and filtering unit may have the first polarizing and filtering film 224 but not the second polarizing and filtering film 226, and the third beam 210c from the nonlinear optical crystal 230 passes through the second surface 222b of the substrate 222, is reflected by the first polarizing and filtering film 224, passes through the second surface 222b, and travels to the reflector 250 in sequence.

A first bandwidth range of the transmission spectrum of the polarizing and filtering unit 220 is narrower than and falls within a second bandwidth range of the reflection spectrum of the first filter 240. In other words, one of the functions of the polarizing and filtering unit 220 is like the function of a narrow bandwidth filter, and the first filter 240 is, for example, a broad bandwidth filter or an edge filter. More particularly, a third bandwidth range of the transmission spectrum of the first polarizing and filtering film 224 is substantially the same as the first bandwidth range. The third bandwidth range is narrower than and falls within a fourth bandwidth range of the transmission spectrum of the second polarizing and filtering film 226, or the third bandwidth range is substantially equal to the fourth bandwidth range. In the present embodiment, the maximum wavelength within the first bandwidth range minus the minimum wavelength within the first bandwidth range is smaller than 0.4 nanometers, i.e. the full width at half maximum (FWHM) of the transmission spectrum of the polarizing and filtering unit 220 is smaller than 0.4 nanometers. Therefore, it is the polarizing and filtering unit 220 that determines the wavelength of the second beam 210b and the wavelength of the third beam 210c but not the first filter 240. Additionally, since the substrate 222 may be made of the material, for example, fused silica or glass, which almost does not absorb the first beam 210a, the second beam 210b, and the third beam 210c, the temperature of the polarizing and filtering unit 220, is almost not increased due to light absorption. In this way, the wavelengths of the second beam 210b and the third beam 210c do not change with the variation of the power, duty cycle, or gating of the light emitter 210, such that the laser module 200 provides the third beam 210c with a stable wavelength.

In the laser module 200 of the present embodiment, since the concave surface 242a of the lens 242 facing the nonlinear optical crystal 230 is a curved surface, the tolerances of the position and the inclined error angle of the first filter 240 with respect to the light emitter 210 is increased, which improves the yield of the laser module 200. However, in other embodiment (not shown), the lens 242 may be replaced by a substrate having a plane surface facing the nonlinear optical crystal, and a dichroic film is disposed on the plane surface. In other words, the substrate is, for example, a transparent plane plate.

In the present embodiment, the laser module 200 further comprises a temperature adjuster 260 connected with the nonlinear optical crystal 230 for adjusting the temperature of the nonlinear optical crystal 230 to an appropriate value such that more proportion of the second beam 210b is converted into the third beam 210c by the nonlinear optical crystal 230. More particularly, the temperature adjuster 260 includes a temperature sensor 262 and a heater 264. The temperature sensor 262 is connected with the nonlinear optical crystal 230. The heater 264 is connected with the nonlinear optical crystal 230 and electrically connected with the temperature sensor 262. The temperature sensor 262 is, for example, a thermistor or a thermal couple. The heater 264 heats the nonlinear optical crystal 230 or let the nonlinear optical crystal 230 cool down naturally according to the temperature data from the temperature sensor 262. In other embodiments (not shown), the heater 264 may be replaced by a thermal electrical cooler. Besides being able to heat the nonlinear optical crystal 230, the thermal electrical cooler is also able to cool the nonlinear optical crystal 230.

Figure 3:
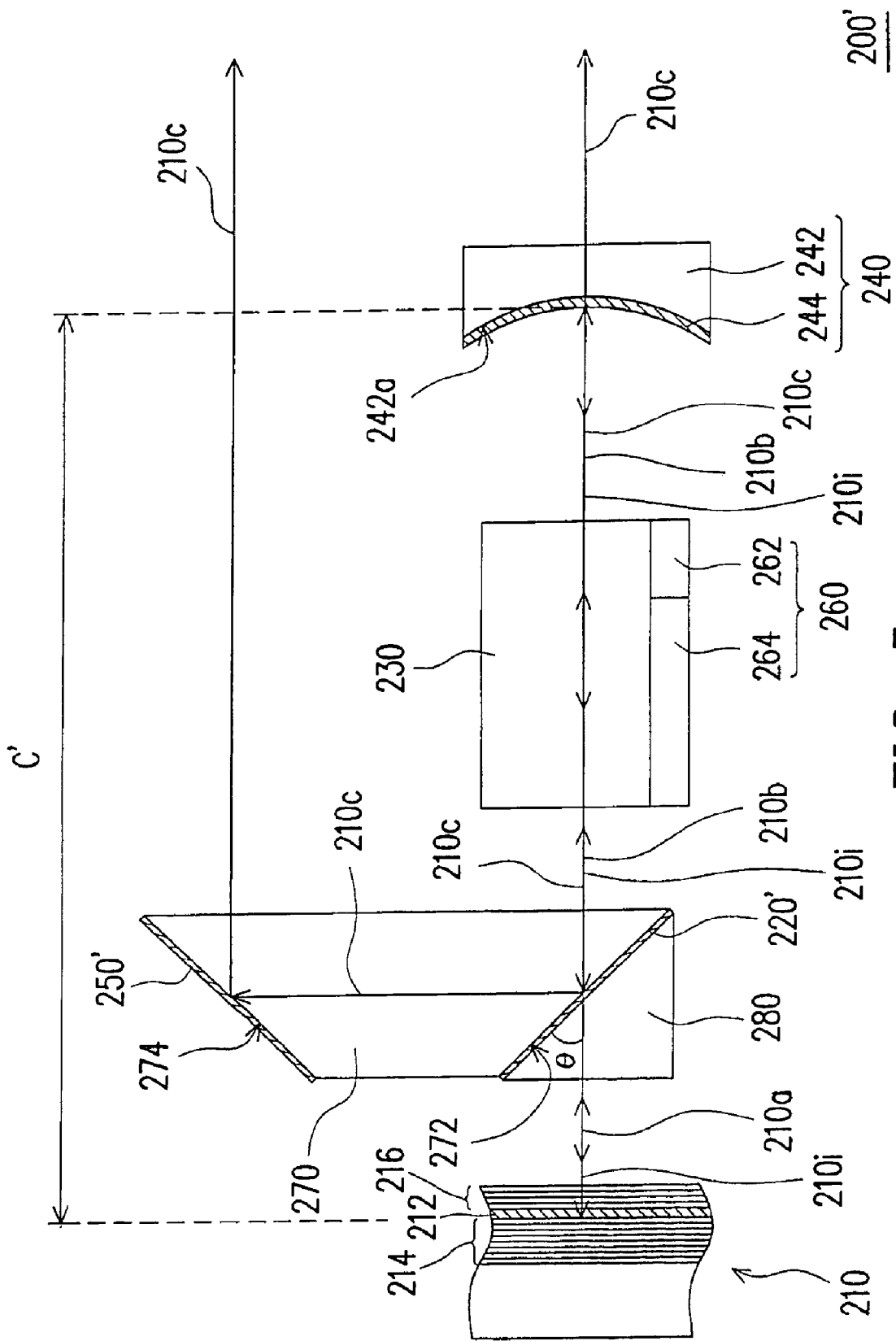
FIG. 3 is a schematic structural view of a laser module according to another embodiment of the present invention.

Referring to FIG. 3, a laser module 200' according to another embodiment of the present invention is similar to the above laser module 200 in FIG. 2 except for the following differences. The laser module 200' further includes a first prism 270 and a second prism 280. A polarizing and filtering unit 220' is, for example, a polarizing and filtering film 220' which is the same as the above first polarizing and filtering film 224 in FIG. 2. A reflector 250' is, for example, a reflecting film. The polarizing and filtering unit 220' and the reflector 250' are disposed on two surfaces 272 and 274 of the first prism 270, respectively. Additionally, the polarizing and filtering unit 220' is sandwiched between the first prism 270 and the second prism 280. The material of the first prism 270 and the second prism 280 may be a material (such as glass or fused silica) almost not absorbing the first, second, and third beams 210a, 210b, and 210c, such that the laser module 200' has the advantages and effects of the above laser module 200 shown in FIG. 2.

Figure 4:
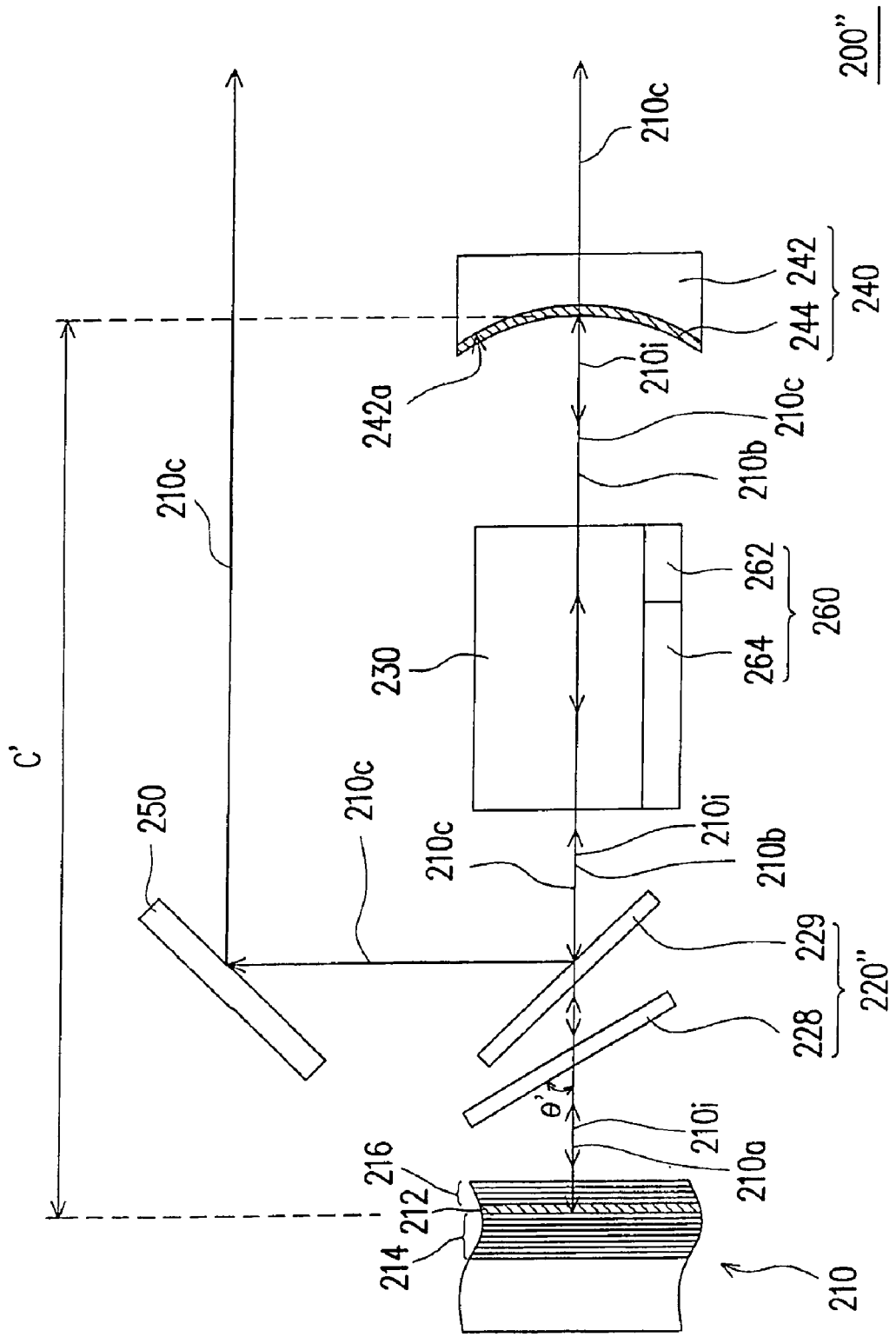
FIG. 4 is a schematic structural view of a laser module according to yet another embodiment of the present invention.

Referring to FIG. 4, a laser module 200" according to yet another embodiment of the present invention is similar to the above laser module 200 shown in FIG. 2 except that the polarizing and filtering unit 220 in FIG. 2 is replaced by a polarizing and filtering unit 220". The polarizing and filtering unit 220" includes a transparent element 228 and a second filter 229. In the present embodiment, the transparent element 228 is, for example, a fused silica plate, which almost does not absorb the first, second, and third beams 210a, 210b, and 210c. However, in other embodiments, the transparent element 228 may be a glass plate or other appropriate transparent element. The first beam 210a form the light emitter 210 is incident on the transparent element 228 with the incident angle θ'. In the present embodiment, the incident angle θ' is substantially at a Brewster's angle, such that the part of the first beam 210a with the specific polarization direction, i.e. the p-polarization direction, passes through the transparent element 228, and the other part is reflected by the transparent element 228. The Brewster's angle, i.e. the incident angle θ', is about 55 degrees for the fused silica plate.

A part of the first beam 210a from the transparent element 228 passes through the second filter 229 to become the second beam 210b with the specific polarization direction. Additionally, a fifth bandwidth range of a transmission spectrum of the second filter 229 is substantially the same as the first bandwidth range. Moreover, the second filter 229 is capable of reflecting the third beam 210c, such that the third beam 210c from the nonlinear optical crystal 230 is reflected by the second filter 229 to the reflector 250. In the present embodiment, the substrate of the second filter 229 may use a material, such as glass or fused silica, almost not absorbing the first, second, and third beams 210a, 210b, and 210c.

In the laser module according to an embodiment of the present invention, the wavelengths of the second beam and the third beam are determined by the polarizing and filtering unit which can use a transparent material, for example, fused silica or glass, almost not absorbing the first, second, and third beam, such that the temperature variation of the polarizing and filtering unit due to light absorption are reduced, which reduces the wavelength deviations of the second beam and the third beam because of the temperature variation of the polarizing and filtering unit owing to light absorption. Therefore, the laser module provides the third beam with a stable wavelength.

The foregoing description of the preferred embodiment of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like is not necessary limited the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A laser module, comprising:
    a light emitter, emitting a first beam;
    a polarizing and filtering unit, disposed on a transmission path of the first beam, wherein a part of the first beam passes through the polarizing and filtering unit to become a second beam with a specific polarization direction;
    a nonlinear optical crystal, disposed on a transmission path of the second beam from the polarizing and filtering unit, wherein the nonlinear optical crystal converts a part of the second beam into a third beam, and the wavelength of the third beam is smaller than the wavelength of the second beam; and
    a first filter, disposed on a transmission path of a non-converted part of the second beam not converted by the nonlinear optical crystal and the third beam from the nonlinear optical crystal, wherein the non-converted part of the second beam passing through the nonlinear optical crystal is reflected by the first filter, the third beam passes through the first filter, and a first bandwidth range of the transmission spectrum of the polarizing and filtering unit is narrower than and falls within a second bandwidth range of the reflection spectrum of the first filter.

2. The laser module according to claim 1, wherein a maximum wavelength within the first bandwidth range minus a minimum wavelength within the first bandwidth range is smaller than 0.4 nanometers.

3. The laser module according to claim 1, wherein the polarizing and filtering unit comprises:
    a substrate, having a first surface and a second surface opposite to each other; and
    a first polarizing and filtering film, disposed on the first surface, wherein the part of the first beam emitted from the light emitter passes through the first polarizing and filtering film, the first surface, and the second surface in sequence to become the second beam, the second beam then travels to the nonlinear optical crystal, and a third bandwidth range of the transmission spectrum of the first polarizing and filtering film is substantially the same as the first bandwidth range.

4. The laser module according to claim 3, wherein the polarizing and filtering unit further comprises a second polarizing and filtering film disposed on the second surface.

5. The laser module according to claim 4, wherein the third bandwidth range is narrower than and falls within a fourth bandwidth range of the transmission spectrum of the second polarizing and filtering film.

6. The laser module according to claim 1, wherein the incident angle of the first beam incident on the polarizing and filtering unit is substantially equal to 45 degrees.

7. The laser module according to claim 1, wherein the polarizing and filtering unit comprises:
    a transparent element, the part of the first beam from the light emitter having the specific polarization direction and passing through the transparent element, wherein the incident angle of the first beam incident on the transparent plate is substantially at a Brewster's angle; and
    a second filter, a part of the first beam from the transparent element passing through the second filter to become the second beam with the specific polarization direction, wherein a fifth bandwidth range of the transmission spectrum of the second filter is substantially the same as the first bandwidth range.

8. The laser module according to claim 7, wherein the transparent element is a glass plate or a fused silica plate.

9. The laser module according to claim 7, further comprising a reflector, wherein the second filter reflects the third beam, and the reflector is disposed on a transmission path of the third beam reflected from the second filter.

10. The laser module according to claim 1, wherein the first filter comprises:
   a lens, having a concave surface facing the nonlinear optical crystal; and
   a dichroic film, disposed on the concave surface.

11. The laser module according to claim 1, wherein the first filter comprises:
   a substrate, having a plane surface facing the nonlinear optical crystal; and
   a dichroic film, disposed on the plane surface.

12. The laser module according to claim 1, further comprising a reflector, wherein the polarizing and filtering unit reflects the third beam, and the reflector is disposed on a transmission path of the third beam reflected from the polarizing and filtering unit.

13. The laser module according to claim 12, further comprising a first prism and a second prism, wherein the polarizing and filtering unit and the reflector are disposed on two surfaces of the first prism respectively, the polarizing and filtering unit is sandwiched between the first prism and the second prism, the polarizing and filtering unit is a polarizing and filtering film, and the reflector is a reflecting film.

14. The laser module according to claim 1, wherein the light emitter comprises:
   a light emitting layer, emitting the first beam;
   a reflecting unit, disposed on one side of the light emitting layer for reflecting the first beam; and
   a partially transmitting and partially reflecting unit, disposed on another side of the light emitting layer opposite to the reflecting unit and on the transmission path of the first beam between the light emitting layer and the polarizing and filtering unit.

15. The laser module according to claim 1, further comprising a temperature adjuster connected with the nonlinear optical crystal for adjusting the temperature of the nonlinear optical crystal.

16. The laser module according to claim 15, wherein the temperature adjuster comprises:
   a temperature sensor, connected with the nonlinear optical crystal; and
   a heater, connected with the nonlinear optical crystal and electrically connected with the temperature sensor.

17. The laser module according to claim 15, wherein the temperature adjuster comprises:
   a temperature sensor, connected with the nonlinear optical crystal; and
   a thermal electrical cooler, connected with the nonlinear optical crystal and electrically connected with the temperature sensor.

18. The laser module according to claim 1, wherein the nonlinear optical crystal is a periodically poled optical crystal.

19. The laser module according to claim 1, wherein the wavelength of the third beam is half the wavelength of the second beam.

* * * * *